United States Patent
Noll

[11] Patent Number: 5,835,695
[45] Date of Patent: *Nov. 10, 1998

[54] METHOD FOR A PRIMARY BIOS ROM RECOVERY IN A DUAL BIOS ROM COMPUTER SYSTEM

[75] Inventor: Michael J. Noll, Nelson, Wis.

[73] Assignee: Micron Electronics, LLP, Nampa, Id.

[ * ] Notice: The term of this patent shall not extend beyond the expiration date of Pat. No. 5,793,943.

[21] Appl. No.: 904,212

[22] Filed: Jul. 31, 1997

Related U.S. Application Data

[62] Division of Ser. No. 688,056, Jul. 29, 1996, Pat. No. 5,793,943.

[51] Int. Cl.$^6$ .............................. G06F 11/00; G06F 11/08
[52] U.S. Cl. ................. 395/182.04; 395/182.09; 395/182.11; 395/185.01; 395/185.07
[58] Field of Search ......................... 395/182.04, 182.03, 395/182.05, 182.09, 182.1, 182.11, 651, 652, 653, 185.01, 185.07; 371/10.2, 21.1, 22.6

[56] References Cited

U.S. PATENT DOCUMENTS

| | | | |
|---|---|---|---|
| 5,245,615 | 9/1993 | Treu | 371/16.5 |
| 5,327,531 | 7/1994 | Bealkowski et al. | 395/164 |
| 5,388,267 | 2/1995 | Chan et al. | 395/652 |
| 5,530,946 | 6/1996 | Bouvier et al. | 395/182.21 |
| 5,579,522 | 11/1996 | Christeson et al. | 395/652 |
| 5,590,075 | 12/1996 | Mazzali | 395/185.22 |

FOREIGN PATENT DOCUMENTS

6110793 A   4/1994   Japan .

*Primary Examiner*—Dieu-Minh Le
*Attorney, Agent, or Firm*—Seed and Berry LLP

[57] ABSTRACT

A computer system includes a dual basic input-output system (BIOS) read-only memory (ROM) system to initialize the computer. When the computer is first powered on or reset, the primary BIOS ROM is initially enabled. The computer analyzes the entire program contents of the primary BIOS memory to detect data errors. If a data error is detected, a chip enable circuit disables the primary BIOS ROM and enables a secondary BIOS ROM containing essentially the same initialization instructions as the primary BIOS ROM. If no errors are detected in the secondary BIOS ROM, the initialization of the computer proceeds using the secondary BIOS ROM. As part of the initialization procedure, the contents of the secondary BIOS ROM are copied to a random access memory. The primary BIOS ROM can then be reprogrammed with the contents of the secondary BIOS ROM using the copy in random access memory, or from the secondary BIOS ROM itself.

15 Claims, 3 Drawing Sheets

METHOD FOR A PRIMARY BIOS ROM RECOVERY IN A DUAL BIOS ROM COMPUTER SYSTEM

This application is a division of United States patent application Ser. No. 08/688,056, filed Jul. 29, 1996 and now U.S. Pat. No. 5,743,943 issued on Aug. 11, 1998.

TECHNICAL FIELD

The present invention relates generally to a method for starting up a computer, and more particularly, to a method for the automatic recovery from a failure of a primary BIOS ROM in a dual BIOS ROM computer system.

BACKGROUND OF THE INVENTION

The use of computers, especially personal computers (PCs) is widespread. The computing power of the PC, whether coupled to a network or operating as a stand-alone device, has increased significantly as new computer designs move into production. In view of the fact that many computer users are relatively unfamiliar with the technical aspects of computer operation, computer manufacturers have made a concerted effort to simplify operation of the computer. For example, many computer systems are pre-loaded with computer software so that a purchaser simply plugs the computer in and turns it on. In addition, software manufacturers have attempted to simplify the operating system itself.

However, there are still certain aspects of computer operation that baffle the typical user, and can cause significant difficulties even for the more experienced user. For example, when the computer is first powered up or reset, a software program, typically designated as a "basic input-output system" (BIOS) initializes the computer and permits the startup of an operating system, such as Microsoft MS-DOS®. The BIOS program typically resides in a read-only memory (ROM). If the BIOS ROM is defective for any reason, the computer will not function properly. Therefore, it can be appreciated that there is a significant need for a system and method to recover from a BIOS ROM failure in a manner that does not require user intervention. The present invention provides this and other advantages as will be apparent from the following detailed description and accompanying figures.

SUMMARY OF THE INVENTION

The present invention is directed to a method for the automatic recovery of a BIOS ROM failure. The computer system includes first and second BIOS memories, each having a plurality of locations and containing data values representing a series of computer program instructions to initialize the computer. A predetermined one of the locations in the first BIOS memory contains an error detection data value based on the data values in the remaining locations of the first BIOS memory. The first BIOS memory is initially enabled and the entire BIOS program contents of the locations in the first BIOS memory are analyzed to detect errors within the first BIOS memory. In response to the detection of an error, the first BIOS memory is disabled and the second BIOS memory is enabled.

The series of computer program instructions in the first BIOS memory is preferably identical to the series of computer program instructions in the second BIOS memory. The predetermined location in the first BIOS memory may contain a check sum, data value indicative of the data values such that the step of analyzing uses the check sum data value to detect errors. Alternatively, the predetermined location in the first BIOS memory may contain a cyclic redundancy check (CRC) data value and the step of analyzing uses the CRC data value to detect errors.

In addition, the second BIOS memory may contain a predetermined location containing an error detection data value based on the data values in the remaining ones of the plurality of locations in the second BIOS memory. The method may further include the steps of analyzing the BIOS program contents of the second BIOS memory and the error detection data value to detect errors in the second BIOS memory. If errors are detected in the second BIOS memory, a halt signal may be generated to halt operation of the computer.

The first BIOS memory may be programmable and have a programming enable input. If errors are not detected in the second BIOS memory, the first BIOS memory may be reprogrammed using the computer program instructions stored within the second BIOS memory.

DETAILED DESCRIPTION OF THE INVENTION

A typical computer contains a single BIOS ROM (not shown) that contains a series of instructions to initialize the computer. If the BIOS ROM fails for whatever reason, the computer will not function properly. In contrast, the present invention has a backup, or secondary BIOS ROM that is automatically enabled upon detection of an error in the first or primary BIOS ROM. At the same time, the primary BIOS ROM is disabled. While the examples presented herein illustrate separate devices for the primary and secondary BIOS ROMs, it is possible to have a single memory device with one portion used as the primary BIOS and a second portion used as the secondary BIOS.

Figure 1:
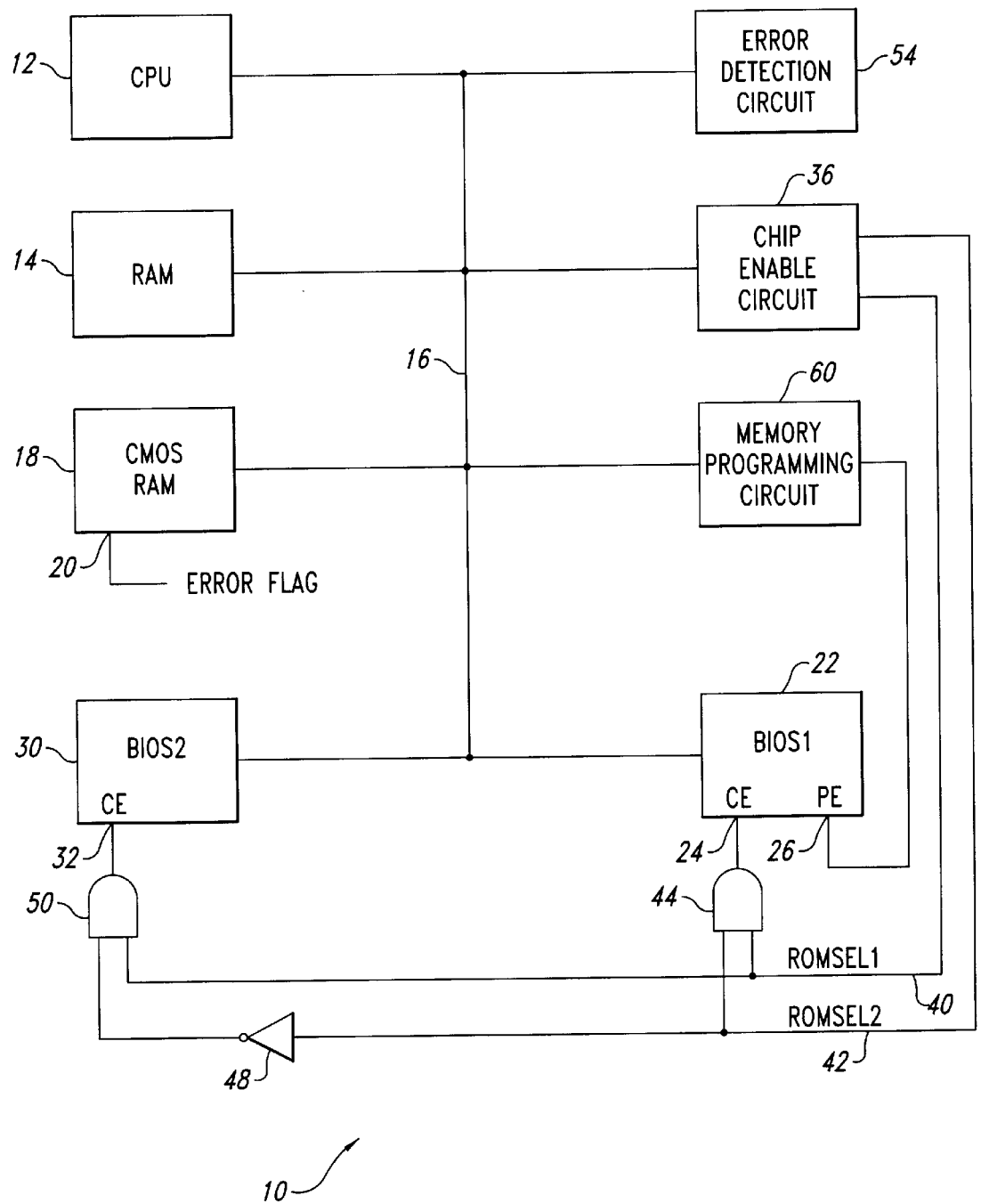
FIG. 1 is a functional block diagram of one embodiment of the system of the present invention.

In one embodiment, the present invention is embodied in a computer 10 illustrated in the functional block diagram of FIG. 1. The computer 10 includes a central processing unit (CPU) 12, such as an Intel Pentium® microprocessor. The computer 10 also includes a random access memory (RAM) 14 and a low power RAM 18, such as a CMOS RAM. The CMOS RAM 18 is used to store configuration data for the computer 10 and is typically powered by a back-up battery (not shown) when the computer is turned off. As will be discussed in detail below, a memory location in the CMOS RAM 18 stores an error flag 20 as an error signal that is written into the CMOS RAM 18 when the computer 10 detects errors. However, the error flag 20 can be stored in the RAM 14 or other suitable storage location.

The various components in the computer 10 are coupled together by a bus system 16, which may carry power and control signals in addition to data and addresses. The bus system 16 may consist of a single bus or several busses interconnected by bus bridges. However, for the sake of brevity and clarity, the bus system 16 is represented in FIG. 1 by a single bus. Also, for the sake of simplicity, other conventional components, such as a power supply, mouse, keyboard, and display are not shown in FIG. 1.

The computer 10 also includes a first or primary basic input-output system (BIOS) read-only memory (ROM) 22.

In one embodiment, the primary BIOS ROM 22 is an Intel No. 28F001BX-T flash programmable memory integrated circuit. However, there are a number of commercial products equally well suited for use in the computer 10. The present invention is not limited by the particular hardware components described herein. The primary BIOS ROM 22 includes a chip enable input 24 and a program enable input 26. The chip enable input 24 enables operation of the primary BIOS ROM 22 so that data contained therein may be read by the CPU 12. The program enable input 26 is used by the computer 10 to reprogram the primary BIOS ROM 22 in the event of a failure in the primary BIOS ROM. The operation of the chip enable input 24 and the program enable input 26 will be discussed in greater detail below.

The computer 10 also includes a secondary or backup BIOS ROM 30. The secondary BIOS ROM could be the same chip type as the primary BIOS ROM 22 to reduce the number of different components required to assemble the computer 10. However, successful operation of the computer 10 does not require that the secondary BIOS ROM 30 be programmable. The secondary BIOS ROM 30 also has a chip enable input 32 to activate operation of the secondary BIOS ROM.

The computer 10 also includes a chip enable circuit 36 that selectively enables and disables the primary BIOS ROM 22 and the secondary BIOS ROM 30. When the computer 10 is first powered up, the chip enable circuit 36 activates a ROMSEL1 control line 40 and a ROMSEL2 control line 42 by setting both of these control lines to a high logic level. The ROMSEL1 control line 40 and the ROMSEL2 control line 42 serve as inputs to an AND gate 44 whose output is coupled to the chip enable input 24 on the primary BIOS ROM 22. Thus, the chip enable circuit 36 initially activates the chip enable input 24 on the primary BIOS ROM 22.

The ROMSEL2 control line 42 is also coupled to the input of an inverter 48 whose output is coupled to the input of an AND gate 50. The ROMSEL1 control line 40 serves as another input to the AND gate 50. The output of the AND gate 50 is coupled to the chip enable input 32 of the secondary BIOS ROM 30. The inversion of the ROMSEL2 control line 42 assures that the secondary BIOS ROM 30 is initially disabled when the computer 10 is first powered up, or reset. In the event that the computer 10 detects an error in the primary BIOS ROM 22, the chip enable circuit 36 causes the ROMSEL2 control line 42 to change to a low logic level. This disables the primary BIOS ROM 22, while also enabling the secondary BIOS ROM 30.

The chip enable circuit 36 may be virtually any type of data storage element, such as a register, that can be controlled by the CPU 12. In the presently preferred embodiment, the chip enable circuit 36 is part of a peripheral component interconnect (PCI) local bus to an industry standard architecture (ISA) bus bridge chip (not shown). The computer 10 switches between the primary BIOS ROM 22 and the secondary BIOS ROM 30 by toggling the ROMSEL to control line 42 in the PCI to ISA bridge chip (not shown). However, those of ordinary skill in the art will readily recognize that any programmable register will operate satisfactorily with the computer 10.

An error detection circuit 54 is used by the computer 10 to detect errors within the primary BIOS ROM 22. It should be noted that the primary BIOS ROM 22 may fail for a number of reasons. For example, degradation of the flash programmable part over time can cause a loss of data. A static charge or high level electromagnetic field may also cause a failure in the primary BIOS ROM 22. Similarly, an interruption during programming of the primary BIOS ROM 22 can cause data errors. Finally, the primary BIOS ROM 22 could simply become defective and fail. An error is considered to exist in the primary BIOS ROM 22 if, for any reason, the primary BIOS ROM does not output the correct data.

The error detection circuit 54 detects changes in the data contained within the primary BIOS ROM 22, no matter what the cause. In a presently preferred embodiment, the primary BIOS ROM 22 includes a checksum data value, which is used by the error detection circuit 54 to detect changes in the data stored within the primary BIOS ROM. The checksum data value is initially determined by summing all of the data values contained within the many computer instructions contained within the primary BIOS ROM 22. The checksum value is the value that is added to the sum to make the total equal zero. However, as those of ordinary skill in the art will readily recognize, other checksum data values can also be used.

It is known that multiple data errors in the primary BIOS ROM 22 may not be detected by the checksum error detection technique if the multiple errors effectively cancel each other. For example, if a particular data bit in one byte changes from a logic zero to a logic one while the same data bit in another byte changes from a logic one to a logic zero, the checksum data value will still be correct. However, such multiple errors are quite uncommon. Therefore, checksum data values are a reliable technique for detecting changes in the primary BIOS ROM 22. Furthermore, other conventional error detection techniques, such as cyclic redundancy check and the like can also be used. Use of checksum errors and other error detection techniques are well known to those of ordinary skill in the art, and need not be described in greater detail herein. However, the present invention is intended to encompass all such techniques for detecting errors in the primary BIOS ROM 22.

If the error detection circuit 54 determines that the primary BIOS ROM 22 contains valid data, the CPU 12 executes the computer instructions within the primary BIOS ROM 22 to perform basic functions such as setting internal registers (not shown) in the CPU to predetermined values. The primary BIOS ROM 22 also causes the CPU 12 to perform basic operations for peripheral devices, such as a keyboard (not shown) and a display (not shown) by setting registers (not shown) in the interfaces of these input/output (I/O) devices. For the sake of brevity, such I/O devices are not illustrated in FIG. 1.

As part of the normal setup procedures, instructions contained within the primary BIOS ROM 22 cause the CPU 12 to perform a "Power-On Self Test" (POST). The POST procedure may include routines such as a check of the RAM 14, peripheral devices (not shown), and the like. The POST procedure is well known to those of ordinary skill in the art, and need not be described in detail herein. As part of the POST procedure, the data in the primary BIOS ROM 22 is copied to the RAM 14. This process is sometimes known as shadowing to reflect the fact that a complete copy of the data in the primary BIOS ROM 22 is copied or shadowed into the RAM 14. One reason for copying the primary BIOS ROM 22 into the RAM 14 is that the access time for the RAM is typically much less than the access time for the primary BIOS ROM. Thus, the instructions contained within the primary BIOS ROM 22 are copied into the RAM 14 so that the instructions may be executed more rapidly by the CPU 12. Another reason that the primary BIOS ROM 22 is copied into the RAM 14 is that some data in the primary BIOS ROM may be in a compressed format and must be decompressed before the CPU 12 can use it. An exact copy of the data in the primary BIOS ROM 22 is initially copied into a low address portion of the RAM 14. After the primary BIOS ROM 22 has been copied into the low address portion of the RAM 14, the chip enable circuit 36 sets the ROMSEL1 control line 40 to a low level, thus disabling both the primary BIOS ROM 22 and the secondary BIOS ROM 30. The CPU 12 subsequently executes instructions from the low address portion of the RAM 14. A different portion (not shown) of the RAM 14, typically having an address space that overlap with the address space of the primary BIOS ROM 22, is designated as a "shadow RAM." Once the CPU 12 is executing instructions from the low address portion of the RAM 14, the data in the low address portion is decompressed if necessary and copied to the shadow RAM (not shown). At this point in time, the CPU 12 will begin executing instructions from the addresses in the RAM 14 that correspond with the addresses in the BIOS ROM 22 until the POST procedure is completed. The computer 10 can use the shadow RAM address space because the primary BIOS ROM 22 and the secondary BIOS ROM 30 have both been disabled by the low logic level on the ROMSEL1 control line 40. At that point, the computer 10 will boot the operating system, such as MS-DOS®.

If the error detection circuit 54, using the checksum, or other error detection techniques, detects an error in the primary BIOS ROM 22, the CPU 12 sets the error flag 20 in the CMOS RAM 18. As will be described in greater detail below, the error flag 20 is used to indicate to the computer 10 that the primary BIOS ROM 22 must be reprogrammed.

After setting the error flag 20, the CPU 12 causes the chip enable circuit 36 to set the ROMSEL2 control line 42 to a low logic level. The low logic level on the ROMSEL2 control line 42 will disable the chip enable input 24 on the primary BIOS ROM 22. The low logic level on the ROMSEL2 control line 42 causes the inverter 48 to output a high logic level, thus enabling the chip enable input 32 on the secondary BIOS ROM 30. The CPU 12 will continue to fetch instructions, however, the instructions will be provided by the secondary BIOS ROM 30, rather than the primary BIOS ROM 22.

The instructions contained within the primary BIOS ROM 22 and the secondary BIOS ROM 30 are typically identical with respect to instructions used to initialize the computer 10. The only instructions that must be identical in both the primary BIOS ROM 22 and the secondary BIOS ROM 30 are instructions relating the actual switch from executing instructions in the primary BIOS ROM to executing instructions in the secondary BIOS ROM. If the CPU 12 is a Pentium, or similar device, it pre-fetches a predetermined number of instructions. Therefore, it is necessary to assure that the predetermined number of instructions relating to the BIOS ROM switching are identical so that any instructions pre-fetched from the primary BIOS ROM 22, but executed by the CPU 12 after switching to the secondary BIOS ROM 30 will not cause the computer 10 to fail. Alternatively, it is possible to include a "far jump" instruction just prior to switching from the primary BIOS ROM 22 which causes the CPU to ignore any pre-fetched instructions. The secondary BIOS ROM 30 contains additional instructions that will reprogram the primary BIOS ROM 22, as will be discussed below. However, it is possible to include the reprogramming instructions in the primary BIOS ROM 22 to minimize the number of different parts in the computer 10. These reprogramming instructions in the primary BIOS ROM 22 will never be executed because the error flag 20 will not be set if no errors are detected in the primary BIOS ROM.

As discussed above, the contents of the primary BIOS ROM 22 are copied into the low portion of the RAM 14 as part of the shadowing POST procedure. However, if an error was detected in the primary BIOS ROM 22, the secondary BIOS ROM 30 is activated. Thus, it is the data contents of the secondary BIOS ROM 30 that are copied into the low portion of the RAM 14. Initialization and operation of the computer 10 proceed as described above with respect to the primary BIOS ROM 22, with the exception that the instructions themselves are provided by the secondary BIOS ROM 30. The error detection circuit 54 also performs an error detection test on the secondary BIOS ROM 30 using the definition of error previously discussed with respect to the primary BIOS ROM 22. If errors are detected in both the primary BIOS ROM 22 and the secondary BIOS ROM 30, the computer 10 cannot be properly initialized. However, a simultaneous failure of both devices is not likely to occur.

As part of the POST procedure, the instructions from the secondary BIOS ROM 30, which have been copied to the RAM 14, cause the CPU 12 to check the error flag 20. If the error flag 20 has been set, the instructions from the secondary BIOS ROM 30 (now in the low address portion of the RAM 14) further instructs the CPU 12 to reprogram the primary BIOS ROM 22 with the data copied from the secondary BIOS ROM 30 into the RAM 14. Although it is possible to copy the contents of the secondary BIOS ROM 30 temporarily to the RAM 14 one instruction at a time and then to program the primary BIOS ROM 22 one instruction at a time, it is convenient to use the contents of the RAM after the secondary BIOS ROM 30 has been copied into the low address portion of the RAM. At this particular point in the POST procedure, the entire contents of the secondary BIOS ROM 30 are located in one area of the RAM 14, thus simplifying and speeding up the process of reprogramming the primary BIOS ROM 22. It is possible to delay reprogramming until after the contents of the low address portion of the RAM 14 have been modified, such as by decompression, and copied to the shadow RAM (not shown). However, precautions must be taken to assure that the low address portion of the RAM 14 is not corrupted or the reprogramming effort will fail. It should be noted that the contents of the shadow RAM cannot be used to reprogram the primary BIOS ROM 22 if it contains decompressed data, since decompressed data is not identical to the original data in the secondary BIOS ROM 30.

A memory programming circuit 60 generates programming signals coupled to the program enable input 26 on the primary BIOS ROM 22. Thus, the contents of the secondary BIOS ROM 30 are copied to the RAM 14, and subsequently used to reprogram the primary BIOS ROM 22. The timing of the programming signals on the program enable input 26 are dependent on the specific type of integrated circuit used for the programmable BIOS ROM 22. However, the programming details are well known to those of ordinary skill in the art, and need not be described in greater detail herein.

It should be noted that several portions of the computer 10, such as the chip enable circuit 36, error detection circuit 54, and memory programming circuit 60 include computer instructions that are executed by the CPU 12. However, for the sake of clarity, these functions are indicated as separate blocks in the functional block diagram of FIG. 1 because each performs a distinct task.

Figure 2A:
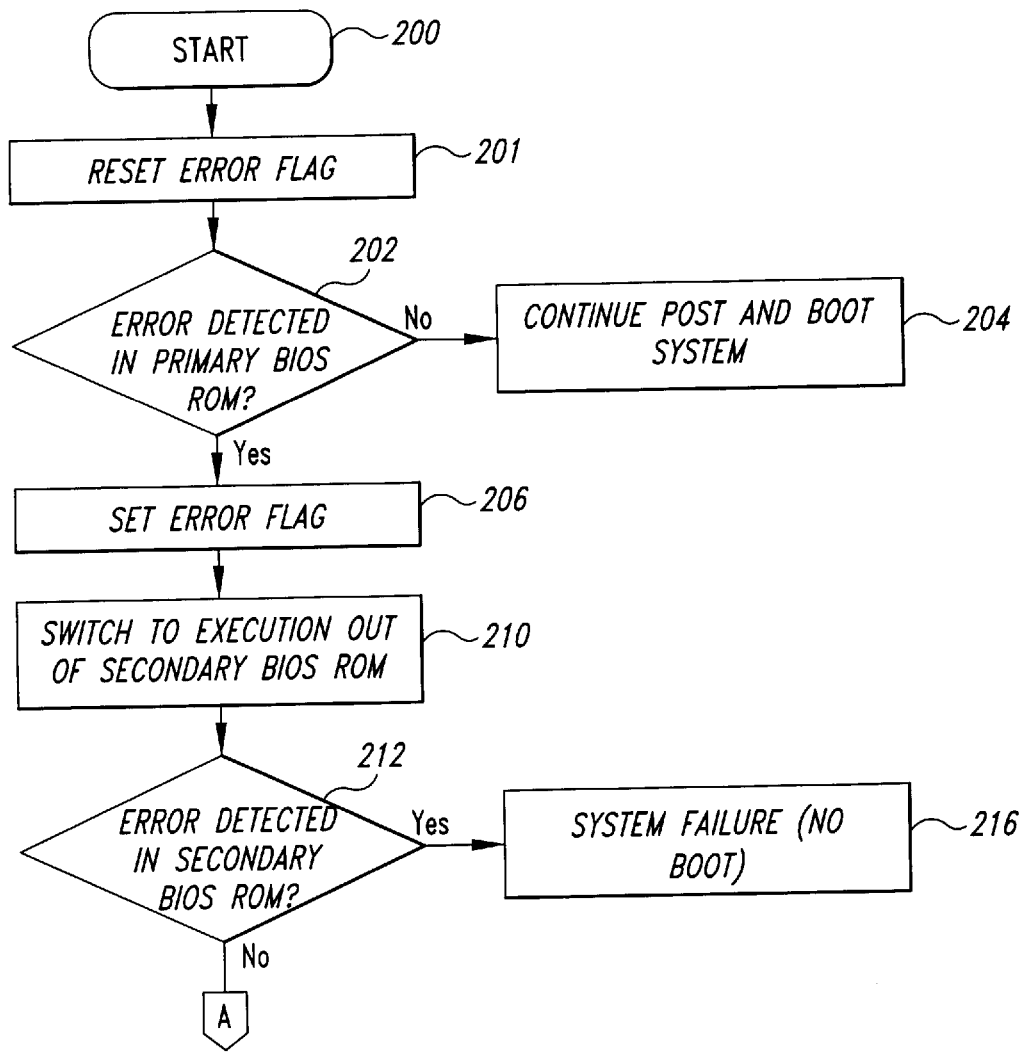
FIGS. 2A and 2B are flowcharts of the operation of the system of FIG. 1.
Figure 2B:
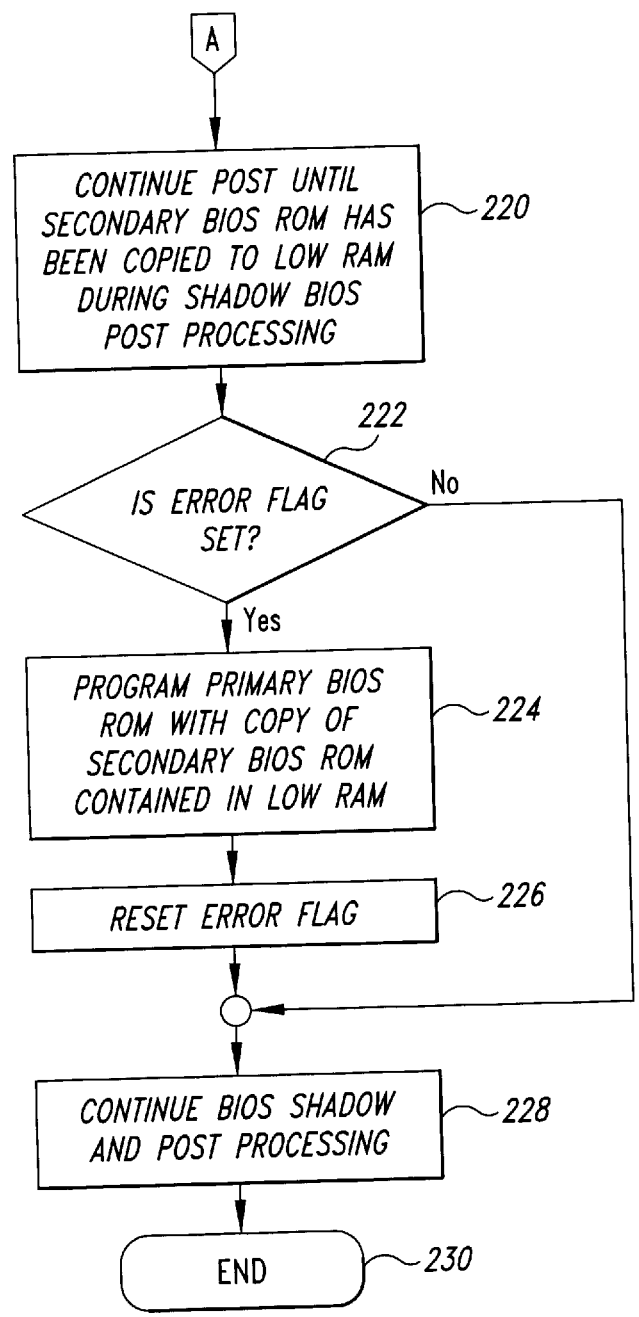

FIGS. 2A and 2B are flowcharts illustrating the software controlling the operation of the CPU 12 in the preferred embodiment of the present invention. At a start 200, the computer 10 (see FIG. 1) has been turned on, or reset such that the computer will undergo an initialization. In step 201, the CPU 12 resets the error flag 20. In step 202, the CPU 12 checks to determine whether the primary BIOS ROM 22 contains a data error. If there is no data error, the result of decision 202 is NO. In that event, the computer 10 continues with the POST procedure in step 204 and boots the computer 10 in the conventional fashion. If the primary BIOS ROM 22 contains an error, the result of decision 202 is YES. In that event, the CPU 12 sets the error flag 20 in step 206. In step 210, the CPU 12 causes the chip enable circuit 36 to change the level of the ROMSEL2 control line 42, thus disabling operation of the primary BIOS ROM 22 and enabling operating of the secondary BIOS ROM 30.

In decision 212, the CPU 12 determines whether the data in the secondary BIOS ROM 30 contains an error. If the secondary BIOS ROM 30 contains an error, the result of decision 212 is YES. In that case, the computer 10 will be unable to complete the POST procedure, and the computer initialization fails in step 216. If the secondary BIOS ROM 30 has no errors, the result of decision 212 is NO. In that event, in step 220, shown in FIG. 2B, the CPU 12 continues with the POST procedure until the contents of the secondary BIOS ROM 30 have been copied to the low portion of the RAM 14 and is executing instructions out of the RAM. As discussed above, this occurs during the shadow BIOS POST procedure.

In step 222, the CPU 12 checks the error flag 20 in the CMOS RAM 18 to determine whether the error flag was set. If the error flag was not set, the result of decision 222 is NO, and the CPU 12 continues the BIOS shadowing process in step 228. If the error flag 20 is set, the result of decision 222 is YES. In that event, in step 224, the CPU 12 uses the memory programming circuit 60 to reprogram the primary BIOS ROM 22 with the data from the secondary BIOS ROM 30, which is now contained the low portion of the RAM 14. In step 226, the CPU 12 resets the error flag 20 in the CMOS RAM 18. Following the reprogramming of the primary BIOS ROM 22, the computer continues the BIOS shadowing process in step 228, and ends in step 230 when the CPU 12 boots the operating system.

Thus, the embodiment of the present invention shown in FIG. 1 has a primary and backup BIOS systems to simplify operation of the computer. This permits the computer 10 to automatically recover from errors in the primary BIOS ROM 22 without any intervention required by the user. The computer 10 also automatically reprograms the primary BIOS ROM 22 with the correct data.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. A method for a basic input-output memory recovery for use on a computer, the method comprising:

providing first and second basic input-output system (BIOS) memories, each having a plurality of locations containing data values representing a series of computer program instructions to initialize the computer, a predetermined one of said locations in said first BIOS memory containing an error detection data value based on said data values in the remaining locations of said first BIOS memory;

enabling said first BIOS memory;

analyzing the entire BIOS program contents of said locations in said first BIOS memory and said predetermined location in said first BIOS memory to detect errors within said first BIOS memory;

in response to said error detection, disabling said first BIOS memory; and in response to said error detection, enabling said second BIOS memory.

2. The method of claim 1 wherein said series of computer program instructions in said first BIOS memory is identical to said series of computer program instructions in said second BIOS memory.

3. The method of claim 1 wherein said error detection value in said predetermined location in said first BIOS memory contains a check sum data value indicative of said data values and said act of analyzing comprises using said checksum data value to detect errors in said data values.

4. The method of claim 1 wherein said error detection value in said predetermined location in said first BIOS memory contains a cyclic redundancy check (CRC) data value indicative of data values for said data, and said act of analyzing comprises using said CRC data value to detect errors in said data values.

5. The method of claim 1 wherein said second BIOS memory contains a plurality of locations containing data values and a predetermined one of said plurality of locations in said second BIOS memory contains an error detection data value based on said data values in the remaining ones of said plurality of locations in said second BIOS memory, the method further comprising:

analyzing the BIOS program contents of said second BIOS memory and said error detection data value in said predetermined location in said second BIOS memory, when said second BIOS memory is enabled, to detect errors in said second BIOS memory; and generating a halt signal to halt operation of the computer upon detection of errors in said second BIOS memory.

6. A method for a basic input-output memory recovery for use on a computer, the method comprising:

starting an initialization operation in a computer containing first and second basic input-output system (BIOS) memories, each having a plurality of locations containing data values representing a series of computer program instructions to initialize the computer, a predetermined one of said plurality of locations in said first BIOS memory containing an error detection data value based on said data values in the remaining locations of said first BIOS memory;

analyzing the entire BIOS program contents of said first BIOS memory and said error detection data value to detect errors in any of said plurality of locations containing data values;

generating an error signal upon detection of errors in said first BIOS memory;

disabling said first BIOS memory in response to said error signal; and enabling said second BIOS memory in response to said error signal.

7. The method of claim 3 wherein said series of computer program instructions in said first BIOS memory is identical to said series of computer program instructions in said second BIOS memory.

8. The method of claim 3 wherein said error detection value in said predetermined location in said first BIOS memory contains a check sum data value indicative of said data values and said act of analyzing comprises using said checksum data value to detect errors in said data values.

9. The method of claim 6 wherein said first BIOS memory is a programmable memory, the method further comprising the act of reprogramming said first BIOS programmable memory with said series of computer program instructions from said second BIOS memory if said error signal was generated.

10. The method of claim 9, further comprising the act of setting a data flag as said error signal, said act of reprogramming said first BIOS programmable memory occurring in response to said data flag.

11. The method of claim 9 wherein said first BIOS programmable memory is a flash programmable read-only memory, and wherein said at of reprogramming with said series of computer program instructions comprises reprogramming said flash programmable read-only memory.

12. The method of claim 6, further comprising:
loading said data values into said random access memory from said first BIOS memory if said error signal was not generated; and
loading said data values into said random access memory from said second BIOS memory if said error signal was generated.

13. The method of claim 12 wherein said first BIOS memory is a programmable memory, the method further comprising the act of reprogramming said first BIOS programmable memory with said data values loaded into said random access memory as part of a power on self-test.

14. The method of claim 6 wherein said error detection value in said predetermined location in said first BIOS programmable memory contains a cyclic redundancy check (CRC) data value indicative of said data values for said plurality of locations, and said act of analyzing comprises using said CRC data value to detect errors in any of said data values.

15. The method of claim 6 wherein said second BIOS memory contains a plurality of locations containing data values and a predetermined one of said plurality of locations in said second BIOS memory contains an error detection data value based on said data values in the remaining ones of said plurality of locations in said second BIOS memory, the method further comprising:

analyzing the BIOS program contents of said second BIOS memory and said error detection data value in said predetermined location in said second BIOS memory, when said second BIOS memory is enabled, to detect errors in said second BIOS memory; and generating a halt signal to halt operation of the computer upon detection of errors in said second BIOS memory.

* * * * *

UNITED STATES PATENT AND TRADEMARK OFFICE
CERTIFICATE OF CORRECTION

PATENT NO.   : 5,835,695
DATED        : November 10, 1998
INVENTOR(S)  : Michael J. Noll It is certified that error appears in the above-identified patent and that said Letters Patent is hereby corrected as shown below:

In column 8, line 57, claim 7, delete "claim 3" and insert therefor --claim 6--.

In column 8, line 61, claim 8, delete "claim 3" and insert therefor --claim 6--.

Signed and Sealed this

Fourteenth Day of December, 1999

Attest:

Attesting Officer

Q. TODD DICKINSON

Acting Commissioner of Patents and Trademarks